United States Patent [19]

Warner et al.

[11] Patent Number: 5,663,033
[45] Date of Patent: Sep. 2, 1997

[54] PEEL-APART PROOFING SYSTEM COMPRISING A HYDROPHILIC BARRIER LAYER

[75] Inventors: David Warner, St. Paul, Minn.; Terence William Baldock, Harlow, Great Britain

[73] Assignee: Minnesota Mining and Manufacturing Company, St. Paul, Minn.

[21] Appl. No.: 162,632

[22] Filed: Dec. 6, 1993

[30] Foreign Application Priority Data

Dec. 9, 1992 [GB] United Kingdom ............. 9225687

[51] Int. Cl.⁶ ................ G03C 11/12; G03F 7/34
[52] U.S. Cl. ............ 430/257; 430/253; 430/260; 430/293
[58] Field of Search .................. 430/253, 257, 430/293, 260

[56] References Cited

U.S. PATENT DOCUMENTS

| | | | |
|---|---|---|---|
| 3,458,311 | 7/1969 | Alles | 96/35.1 |
| 4,260,673 | 4/1981 | Krech | 435/143 |
| 4,304,836 | 12/1981 | Cheema et al. | 430/252 |
| 4,963,462 | 10/1990 | Wilczak | 430/143 |
| 5,094,931 | 3/1992 | Platzer | 430/257 |
| 5,100,757 | 3/1992 | Platzer et al. | 430/143 |
| 5,232,814 | 8/1993 | Graves et al. | 430/158 |
| 5,248,583 | 9/1993 | Lundquist et al. | 430/143 |
| 5,443,937 | 8/1995 | Bodager et al. | 430/143 |

FOREIGN PATENT DOCUMENTS

| | | |
|---|---|---|
| 0 385 466 | 9/1990 | European Pat. Off. |
| 0 514 186 | 11/1992 | European Pat. Off. |
| 0 525 624 | 2/1993 | European Pat. Off. |
| 92/15920 | 9/1992 | WIPO |
| WO/92/15920 | 9/1992 | WIPO |
| 93/15438 | 8/1993 | WIPO |

Primary Examiner—John S. Chu
Attorney, Agent, or Firm—Walter N. Kirn; Gary L. Griswold; Mark A. Litman

[57] ABSTRACT

A colour sheet suitable for use in peel-apart colour imaging comprising a substrate bearing a layer of pigmented photopolymerizable material overcoated with a hydrophilic barrier layer and an outer layer of an adhesive.

18 Claims, 1 Drawing Sheet

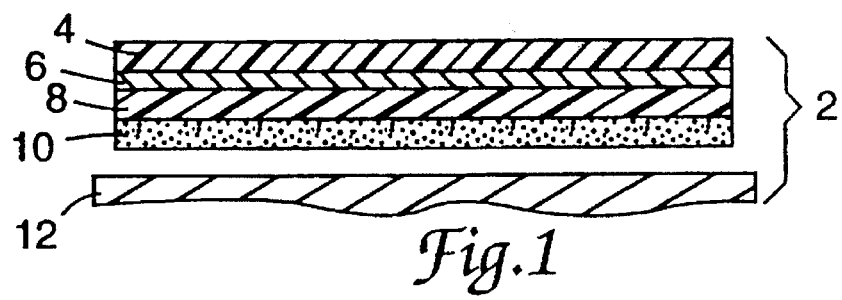
Fig.1
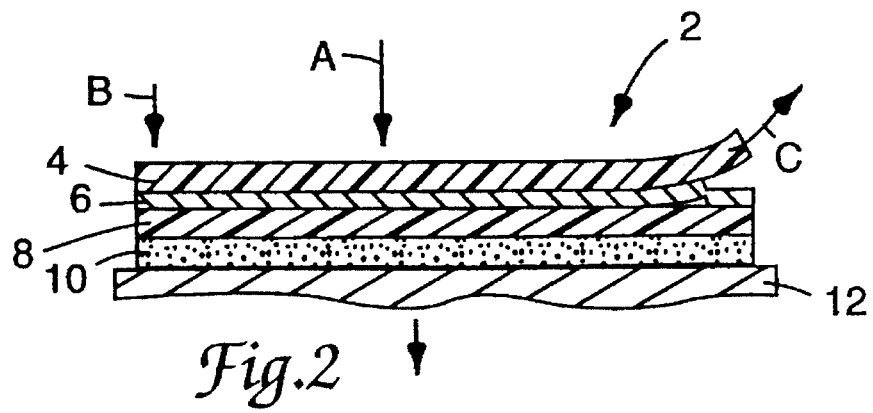
Fig.2
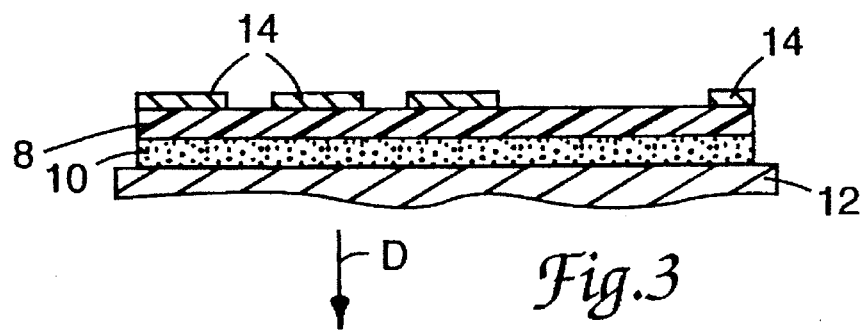
Fig.3
Fig.4
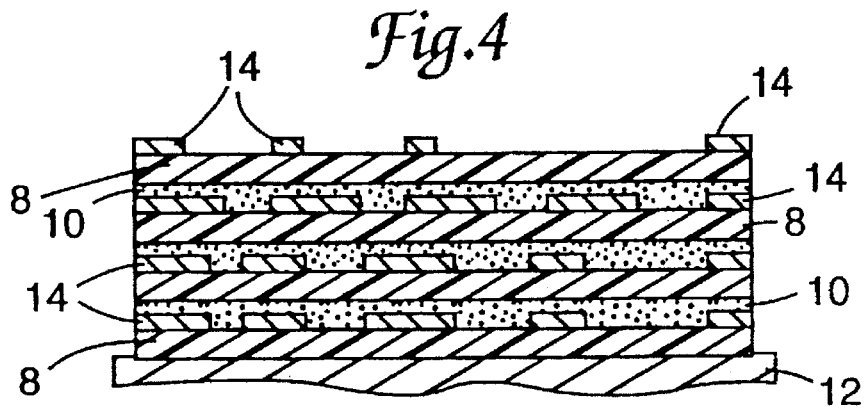

PEEL-APART PROOFING SYSTEM COMPRISING A HYDROPHILIC BARRIER LAYER

FIELD OF THE INVENTION

This invention relates to photosensitive elements developed by a peel-apart dry-development step and to their use in forming a surprint colour proof.

BACKGROUND TO THE INVENTION

The need for off-press colour proofing materials in the graphic arts industry as an agreed standard between printer and customer, to define the finished look of printed material and to set up printing press conditions is well known. There are many proofing systems commercially available which fall into two general categories; critical or non-critical, depending on whether high or lower quality colour images are produced.

One type of proofing system is the wet-developed overlay proofing system. In overlay systems the colour layer is mounted on a transparent plastic support. Each colour sheet is exposed and wet-developed. Four single colour images are obtained, each on its support; cyan, magenta, yellow and black. These are then overlaid in register, giving a full colour image with four relatively thick plastic support sheets intervening. Proofs composed in this manner must be non-critical for several reasons including internal reflection and a high optical dot-gain from the four intervening plastic sheets. Examples of commercially available wet-developed overlay proofs include 3M Color Key, Enco NAPS and PAPS, Kodak Double Check and Fuji Color Art Overlay.

Wet-developed single-sheet proofing systems are known including those available commercially under the trade names 3M Matchprint, Agfaproof, Fuji Color Art, and Polaroid SpectraProof. Proofing materials for such proofing systems are usually composed of cyan, yellow, magenta and black colour sheets. In the Matchprint system the first colour sheet, often cyan, is laminated onto Matchprint base receptor (white card) and its transparent colourless support sheet removed. The colour layer on the base is contact exposed through a corresponding graphic arts film colour separation. The base and colour layer are then passed through a wet-developer machine, after which the cyan image component is visible. The next colour sheet is then laminated onto the first image, support removed, exposure carried out with the appropriate colour separation in register with the underlying image, and wet developed. The laminate-expose-develop cycle is repeated for the two remaining colour components and a full colour high quality surprint (integral) proof produced. The Fuji Color Art system employs similar process steps, but in the sequence: exposure, wet development and lamination. Lamination of the second and subsequent sheets must be carried out in register with the first image.

These and other wet-development systems involve a colour layer which, in a development liquid, becomes less soluble (negative-acting) or more soluble (positive-acting) when light exposed. During development the more soluble portions of the coloured material are washed away in the developing liquid, revealing the image. A typical construction is disclosed in U.S. Pat. No. 3,671,236 and comprises a carrier sheet in releasable attachment to a photosensitive colour layer, over which is coated in turn a water-insoluble colourless transparent barrier layer and a pressure-sensitive adhesive layer. The barrier layer is designed to withstand attack by aqueous-organic developer solutions, and polyacrylate resins are exemplified as suitable barrier materials. The barrier layer is designed to withstand attack by aqueous-organic developer solutions, and polyacrylate resins are exemplified as suitable barrier materials. Some systems are based on conventional silver halide image development, but currently these also require wet chemical development.

Despite the success of wet-developed contact proofing systems, they suffer from two major disadvantages which are becoming increasingly important. Developing machines normally require a continuous supply of fresh developer to replace reacted developer and maintain consistency, so therefore drums of developer must be regularly delivered. There is also a continuous discharge of chemical waste during processing into the drainage system which is undesirable in view of the increasing importance of environmental acceptability in product use. For these reasons, there has been an increasing interest in dry-developed contact proofing.

Potential methods of dry-development include thermal dye transfer, thermal mass transfer, peel-apart methods, and toner application methods.

There are commercially available proofing systems based on a colourless coated surface which after imagewise exposure carries a tacky image. Toner powder (Cromalin proofing system) or a coloured donor coating (Eurosprint proofing system) (both available from DuPont) is applied to this receptor sheet, transferring colour to the tacky areas.

One of the simplest methods of dry process proofing is a peel-apart system. Potential advantages include lower wet waste production, faster throughput and reduced machinery requirements. For these reasons the interest in obtaining a dry developed colour proofing system has increased.

Peel-apart processing constitutes a simple method of dry developing an essentially one colour image. In its simplest form, two co-extensive sheets, e.g. of polyester, sandwich a coloured layer. The construction is exposed imagewise through whichever sheet is considered the cover and peeled apart by gaining a purchase on the coversheet (or base) and peeling the coversheet from the base. The colour layer breaks imagewise with a positive image of the exposure mask separating on the cover and the corresponding negative image on the base or vice-versa.

Generally, the basis of this type of peel-apart system has been photopolymerisation chemistry in the colour layer which is imagewise photohardened. This is one way of supplying a photochemically induced change in the mechanical properties of the colour layer which is needed for an imagewise separation.

Cromacheck, an overlay peel-apart system commercially available from DuPont consists essentially of the above system. This, and related systems are disclosed in U.S. Pat. Nos. 3,754,920, 4,282,308, 4,247,619, 4,489,153 and 4,316,951. Each colour sheet is imagewise exposed through the appropriate colour separation and peeled to give cyan, magenta, yellow and black images on separate supports which are then overlaid in register to give a non-critical proof. The peel-apart elements generally comprise (in order) a strippable cover sheet, a photoadherent layer, a non-photosensitive tacky contiguous layer and a substrate. The photoadherent layer may be coloured, in which case imagewise exposure and peel-apart reveals the image immediately, or it may be colourless, in which case the image is revealed by applying toner powder to the areas of the tacky contiguous layer that are bared by the peel-apart process, as disclosed in U.S. Pat. No. 4,247,619. The tacky contiguous layer generally comprises a soft, elastomeric resinuous material.

The disadvantages of the overlay scheme have been outlined above and a high quality critical proof cannot be made because of the intervening transparent plastic supports.

The peel-apart overlay method involves two steps per colour (exposure and peel-apart) plus the final assembly of the four colours in register to give the full colour image—a total of nine steps. Although the image thus produced is non-critical it has the advantage that the assembly method is simple and quick. In proofing it is highly desirable that the minimum number of steps be involved in making the proof so that maximum productivity may be obtained. One of the two pieces of polyester is discarded per colour layer. It is also desirable to keep polyester usage and waste to a minimum. Polyester is an expensive material component in products of this type.

Peel-apart development has also been applied to the production of surprint (integral) proofs.

For example, EP-A-0385466 discloses a method which involves a peel, laminate, expose and imaging peel-apart step for each colour sheet but no separate final assembly—a total of sixteen steps. Two pieces of polyester are discarded per colour layer. Each sheet comprises a support bearing an elastomeric layer, colour photolayer, release layer and cover. The support is removed from a first colour sheet and the elastomeric layer laminated to a base. After exposure the cover is removed as the peel-apart developing step. Thereafter, each colour sheet is applied, exposed and developed sequentially.

U.S. Pat. No. 4,987,051 discloses a system in which each colour sheet comprises a support bearing an elastomer layer, colour photopolymer layer and cover. For integral proof assembly, each colour layer support is removed and then lamination carried out. The cover is then removed, exposure is carried out, the cover relaminated, a blanket exposure carried out and then the cover is peeled once more to develop the colour image. This gives an integral proof but involves a total of twenty-eight steps, seven per colour layer. A similar scheme is disclosed in EP-A-0514186.

A similar scheme which relies on the photogeneration of an inhibitor in exposed areas also gives a negative-acting surprint proof as disclosed in U.S. Pat. No. 4,923,780. U.S. Pat. No. 4,489,154 discloses a system in which each colour sheet comprises a support, elastomer layer, colour layer and cover.

The process involves exposure of each sheet, peel-apart, lamination in register onto a receptor and a further peel-off—a total of sixteen steps per proof with two pieces of polyester discarded per colour layer.

U.S. Pat. No. 4,895,787 discloses a system in which each colour sheet comprises a cover in the form of an adhesion promoted substrate bearing a colour layer and hot melt adhesive layer. The sheet may be exposed before or after lamination to a receptor and thereafter the cover peeled-apart. Very similar materials are disclosed in EP-A-0525624.

This method is perhaps the simplest, involving lamination, exposure through a cover sheet and peel-apart—a total of twelve steps per proof. Only one piece of polyester is used and then discarded per colour layer. However, the number of adhesives that can be used is limited because the adhesive must (a) be coated out of a solvent that does not disrupt the underlying colour layer or (b) be hot-melt coated or laminated or (c) be coated as an aqueous emulsion which must transparentise when dried. Most of the examples in the patent describe application of the adhesive by lamination rather than coating. If this is the procedure used, then more polyester supports may be required for the adhesive donor sheets. Each of the four colour sheets requires a donor sheet for adhesive application composed of a polyester support and the hot-melt adhesive layer. This could be part of the proof assembly process as used by the customer, or done during the manufacturing stage. The total effective number of supports used is thus eight. One other potential problem with this type of construction where the adhesive layer is in direct contact with the colour layer is staining, caused by migration of coloured materials into the adhesive layer during manufacture or assembly.

U.S. Patent Nos 4,910,120 and 4,963,462 disclose more complicated schemes involving twenty steps. Two pieces of polyester are discarded per colour layer. However, the methods have the potential for choice of the receptor base, e.g. printing stock on which to view the proof. Other proofing schemes are disclosed in European Patent Publication Nos. 0465087 and 0365362.

The aforementioned methods for integral proofing disclosed in the art are summarised in the following table:

| Patent Publication Number | Number of Steps | Number of Discarded Supports | Image (relative to mask) |
|---|---|---|---|
| EP 0385466 | 16 | 8 | Negative |
| US 4,987,051 | 28 | 8 | Negative |
| US 4,489,154 | 16 | 8 | Negative |
| US 4,923,780 | 16 | 4 | Negative |
| US 4,895,787 | 12 | 4 | Positive |
| US 4,963,462 | 20 | 8 | Positive |
| EP 0465087 | 20 | 8 | Positive |
| US 4,910,120 | 20 | 8 | Positive |
| EP 0365362 | 20 | 8 | Negative |

The type of image (negative or positive) refers to the polarity of the final image on the base in relation to the image on the transparency through which the photosensitive media is exposed. In the case of a negative-acting system, the photosensitive layer prior to exposure shows a greater adherence to the strippable substrate than to the base, but after exposure, adheres preferentially to the base.

As can be seen from the table, U.S. Pat. No. 4,895,787 allows for the minimum waste of polyester and the minimum number of steps. This gives a positive-acting surprint proofing system.

More complex peel-apart elements suitable for the construction of integral proofs are disclosed in International Patent Application No. WO92/15920. These comprise (in order) a strippable coversheet, a photohardenable layer, a contiguous layer, a non-elastomeric isolation layer, an adhesive layer and a support. In use, the support is removed and the element laminated to a base via the adhesive layer. Thereafter, the element is imagewise exposed through a coversheet which is then peeled, removing with it areas of the photohardenable layer in accordance with the imagewise exposure. In embodiments in which the photohardenable layer is coloured, this reveals an image. In embodiments in which the photohardenable layer is not coloured, it is necessary to apply toner to the bared areas of the contiguous layer. Depending on its formulation, the photohardenable layer may adhere preferentially to the cover sheet or to the contiguous layer in exposed areas, and so the system may be adapted to provide either positive or negative proofs.

The contiguous layer comprises a soft, deformable material such as a rubber or other elastomeric polymer. The isolation layer comprises a non-elastomeric polymer that is less deformable than the polymers contained in the contiguous and adhesive layers. Exemplified materials are polymers and copolymers of vinyl acetate and acrylic polymers. The media are said to give improved quality images with reduced dot gain, but the exact function of the isolation layer is not described.

It can be seen in many of the above schemes that in order to obtain a left to right reading image, exposure must be through a relatively thick support/cover layer. It is well known that exposure through a thickness of a transparent substrate detrimentally affects image resolution or dot size by light undercutting the shielding areas of the exposure mask. This can be avoided by removing the cover and exposing, then relaminating the cover for the peel-apart step. However, this introduces additional time consuming steps lowering productivity and increasing the complexity of proof assembly for the end user.

It is well known that reflection of radiation from the white supporting base during the imaging exposure, (known as halation) detrimentally affects image quality. This, and the undercutting, reduce image quality. However, the reflected component can be reduced by incorporating an actinic radiation absorbing antihalation material in a layer opposite to the exposing side of the photosensitive layer. This improves image quality in the resultant peel-apart image. The incorporation of such a material is difficult in the simplest of the methods in the art. Such a material might be included in the adhesive layer, but the number of solvents usable is limited since this is coated directly onto the solvent sensitive photosensitive layer. Use of a water based adhesive even further limits the number of radiation absorbing compounds that might be used.

BRIEF SUMMARY OF THE INVENTION

The present invention provides an alternative colour sheet construction for use in a system capable of providing either a negative-acting, or a positive-acting full colour surprint proof.

Therefore according to the present invention there is provided a colour sheet suitable for use in peel-apart colour imaging comprising a substrate bearing a layer of pigmented photopolymerisable material overcoated with a hydrophilic barrier layer and an outer layer of an adhesive.

The invention also provides a method of preparing a full colour proof which comprises laminating a colour sheet as defined above to a support base, exposing the sheet through its substrate, peeling the substrate from the sheet to remove either the exposed or the unexposed regions of the pigmented photopolymerisable material, and repeating the lamination, exposure and peeling steps with additional colour sheets to build up a full colour proof comprising cyan, magenta, yellow and optionally black layers.

Depending largely on the surface properties of the substrate and the formulation of the pigmented photopolymerisable material (as will be later described), the colour sheets of the invention may be adapted to provide either a positive or a negative image relative to the mask through which exposure is made. The ability to obtain either type of image from the same basic layer structure by identical procedures is also shown by the media disclosed in WO92/15920, but these materials require the presence of an additional layer compared to the materials of the present invention, which adds to the manufacturing costs.

Other advantages of the invention over prior art systems are reduced polyester waste, simple customer assembly in a minimum number of steps, and a hydrophilic barrier layer which allows for solvent coating of adhesives during manufacture. Prior art methods for construction of a surprint negative-acting dry-developed proof involve more plastic support wastage or an additional number of steps (which lowers customer productivity) or both, or require a more complex layer structure.

BRIEF DESCRIPTION OF THE DRAWINGS

FIG. 1 shows a peel-apart element of the present invention 2 and a receptor base 12.

FIG. 2 shows a peel-apart element of the present invention 2 adhered to a receptor base 12.

FIG. 3 shows an imaged peel-apart element of the present invention with the stripped image 14 shown.

FIG. 4 shows a composite image of four separate images 14 adhered to a receptor surface 12.

DESCRIPTION OF PREFERRED EMBODIMENTS

The invention will now be described with reference to the accompanying drawing which illustrates the construction of a colour sheet and its use in producing a negative colour proof.

The colour sheet of the invention (2) comprises a thin substrate (4) transparent to the imaging radiation, bearing a coloured photosensitive layer (6), a hydrophilic barrier layer (8) and an adhesive layer (10) which may include an antihalation dye (not shown).

The colour sheet is laminated (A) onto a support base (12) (e.g. Matchprint paper base), and imagewise exposed (B) through the support (4). Thereafter the substrate is peeled (C) from the construction taking with it the unexposed regions of the coloured photosensitive layer (6) leaving the exposed regions (14).

The procedure is repeated three times (D) with appropriate colour sheets exposed in register to build up a full colour proof comprising yellow, cyan, magenta and black.

In an alternative embodiment of the invention, exactly the same procedure may be followed in order to produce a positive proof, with the exception that at step (C) the exposed areas of layer (6) are removed by peeling of the substrate (4), leaving the unexposed areas of layer (6) adhered to the barrier layer (8).

As stated above, the novel colour sheet construction of this invention can be adapted to produce either a negative-acting or a positive-acting proof. By definition, a negative-acting peel-apart proof requires that the net adhesion of the colour layer (6) before light exposure must be to the substrate (4), so that on peeling away the substrate (4), the unexposed colour coating must be removed with that substrate. After, and as a result of, light-exposure, the net adhesion of the colour layer must be to the barrier layer (8), so that on peeling away the substrate (4), exposed areas of the colour layer remain on the barrier layer which, being adhered to the final proof base (12) by adhesive (10), forms part of the final proof image. Also by definition, to obtain a positive-acting proof requires that the net adhesion of unexposed areas of the colour layer must be to the barrier layer (8), and the net adhesion of the exposed areas must be to the substrate (4).

The net adhesions are the resultants of, inter alia, the individual specific chemical adhesions of the unexposed colour layer to the substrate and barrier layers, the specific adhesions of the light-exposed colour layer to the substrate and barrier, and certain geometrical and mechanical factors redating to whether it is the substrate (4) or the final proof base (12) that is held flat during the peel process. In normal circumstances, the final proof base (12) is stiffer and thicker than the substrate (4), and hence remains substantially flat during the peel process while the substrate (4) adopts a much sharper curve. For the purposes of the present invention it is always to be assumed that the base (12) remains substantially flat during the peel process.

To obtain the specific adhesions needed to control the polarity of peel, and thus obtain by choice a negative or a positive proof, the nature of the surface of the substrate (4), the ingredients of the colour layer, and the nature of the barrier layer surface may be varied. Indications of some important factors influencing image polarity are contained in the prior art. For example, to obtain a negative proof, the substrate surface contiguous to the colour layer should be of untreated polyester, or polyester coated with a "photorelease" layer (as described in U.S. Pat. No. 5,028,511). The surface should not show an increased adhesion to the colour layer when the latter is photoexposed (referred to as "photoadhesion" in the prior art). Conversely, for a positive-acting proof, the substrate surface should form an increased-adhesion bond to the colour layer when the latter is photoexposed and polymerised. In this case, suitable substrates are termed adhesion-promoted substrates, of which corona-treated polyester, flame-treated polyester and some varieties of precoated (subbed) polyester are examples. However, such adhesion-promotion treatments should not be of such a nature, or to such a degree, that the colour layer adheres preferentially to the substrate before exposure. The colour layer itself comprises a photopolymerisable or photocrosslinkable mixture of colour pigments, binder resin(s), polymerisable monomer(s) and a photoinitiator system. Any of these ingredients may affect the adhesion properties of the colour layer towards its contiguous surfaces. For example, in a negative-acting proof where the unexposed colour layer must adhere preferentially to the substrate (4), and not to the hydrophilic barrier layer (8), a non-polar binder resin is preferred. In a positive-acting proof, where the unexposed colour layer is required to adhere preferentially to the hydrophilic barrier layer, a more polar binder resin is indicated, for example one containing carboxylic acid groups or hydroxyl groups.

The hydrophilic barrier layer used in this invention may contain one or more surfactants as coating aids, and the nature and quantity of these provides an additional means of influencing the adhesion between the colour layer and the dried hydrophilic barrier layer.

As stated previously, in peel-apart processes the peel geometry is observed to influence the polarity of the image formed. Amongst other factors, it is believed that the physical properties induced by photohardening in the light-exposed areas of the colour layer can create a preference for those areas to remain attached to whichever contiguous surface is held flatter during the peel process. Since it is normally the base (12) that is held flatter, this physical effect may be expected to aid formation of a negative proof, and hinder formation of a positive proof. Therefore, when a positive proof is required, it may be beneficial to limit the degree of hardness or stiffness induced by photocuring in the exposed areas of the colour layer. One method of achieving this is the creation of two or more phases in the colour layer by use of incompatible mixtures of binder resins and/or monomers, as described, for example, in U.S. Pat. No. 4,286,043. This also serves to reduce the cohesive strength of the colour layer, so that it splits easily in the direction perpendicular to its major surface, allowing small, well-defined image elements (e.g. half-tone dots) to be reproduced.

The method of preparing a full colour proof described herein discards four supports and involves a total of twelve steps, the same number of steps as the prior art methods of U.S. Pat. No. 4,895,787 and International Patent Application No. WO92/15920. It will be noted that the main difference in construction between the materials of the present invention and those of the prior art is the presence of a hydrophilic barrier layer (8) between the colour photosensitive layer (6) and the adhesive layer (10). ("Hydrophilic" in this context means that the materials of which the barrier layer is composed have a high affinity for water, i.e. they are swellable by water or, more preferably, soluble in water). Of the above-referenced prior art documents, only WO92/15920 describes both positive and negative acting systems. The relevant materials have two layers separating the photosensitive and adhesive layers, as opposed to the single hydrophilic barrier layer of the present invention, and hence require a more complex manufacturing process.

A further advantage of a hydrophilic barrier layer as herein described is the ability to coat the adhesive layer (10) from a variety of solvents without disrupting neighbouring layers, notably the coloured layer. The prior art materials require lamination of the adhesive layer, which is less convenient from a manufacturing standpoint. Yet another advantage of the hydrophilic barrier layer is its ability to act as an oxygen barrier towards the coloured photopolymer layer, with potential benefits in stability and sensitivity.

The substrate may be any of the materials commonly used in peel-apart media, but for reasons of cost, availability, optical clarity, and dimensional stability, polyester is the material of choice. The substrate must be transparent to the imaging radiation. Thinner substrates improve resolution, but at the expense of an increased tendency to crease and wrinkle. A thickness in the range 10 to 25 micron represents a good compromise, although other thicknesses (e.g. 5 to 50 micron) may be used.

The substrate may be subjected to any of the known treatments (e.g. corona treatment) to alter its wettability towards subsequently-applied coatings, and may possess additional subbing or release layers to modify the adhesion of such coatings, depending largely on the choice of materials for the coloured layer and the desired polarity of image. In the negative-acting embodiments described herein, best results are obtained with polyester base that is untreated. In positive-acting embodiments, best results have been obtained with adhesion-promoted (subbed) or corona-treated polyester base.

In principle, any pigment (organic or inorganic) may be used, providing it has the desired colour and suitable light fastness and thermal stability for the purpose intended. Particularly suitable pigments are those currently supplied to the colour proofing industry, as they are available in shades which allow matching of internationally agreed standards for colour reproduction. Examples of such pigments include 249-0592, 248-0615, 234-0071, 275-0570 (all available from Sun Chemical Co.), RV-6853 (Mobay), 1270 (Harshaw) and Raven-760. Other examples are listed in European Patent Publication No. 385466.

Generally, the smaller the pigment particle size, the better the resolution achievable, but this may be counteracted by other factors such as the quality of the dispersion. A distribution of particle sizes will normally be present, but preferably no particles or agglomerates of particles should be so large as to affect resolution on the micron scale. The quantity of pigment will vary with factors such as layer thickness, the optical density desired and the optical properties of the pigment itself, but typical values are in the range 10 to 70% by weight of the total involatiles of the photopolymerisable coloured layer. The preferred pigment loading is in the range 15 to 30 wt %.

The photopolymer layer may comprise a binder chosen from a wide variety of homopolymers, copolymers and blends of polymers. The main criteria are film forming ability, optical clarity, solubility in the commonly used coating solvents, e.g., acetone, methyl ethyl ketone etc. and compatibility with the pigment. Suitable materials include vinyl polymers, such as polyvinylbutyral, polyvinylformal and polymers and copolymers of vinyl chloride, vinyl acetate, vinyl ethers etc., acrylic polymers such as poly(alkyl acrylates) and poly(alkyl methacrylates), cellulose esters, polyesters, polyamides, polycarbonates and phenolic resins. Preferred materials include VAGH (a copolymer of vinyl chloride and vinyl acetate (partially hydrolysed) available from Union Carbide) Resinox 7280 (a phenolic resin available from Monsanto), preferably modified by reaction of a proportion of the phenol groups with a di-isocyanate, polyvinylformal, and carboxy-functional acrylate resins (such as those available from S. C. Johnson under the tradename "Joncryl").

In addition to the above ingredients, the photopolymer layer comprises a photocuring system, which will normally consist of one or more polymerisable monomers, a photoinitiator and, optionally, a sensitiser. Any of the commonly used unsaturated monomers may be used, but preferably at least a proportion of the monomers are at least bifunctional, so that a cross-linked network is produced on curing. Suitable monomers are listed, for example, in European Patent Publication No. 385466. Preferred monomers include trimethylolpropane trimethacrylate, ethyleneglycol dimethacrylate, tetraethyleneglycol dimethacrylate and tripropyleneglycol diacrylate. The monomers typically constitute 30 to 50 wt % of the involatiles in the coloured layer, but this may vary depending on the nature of the other ingredients.

A wide variety of photoinitiators may be used, such as those disclosed in European Patent Publication No. 385466. Preferred initiators include trichloromethyltriazine derivatives and onium salts such as iodonium and sulphonium salts. If necessary, a sensitiser may be included. It is highly desirable that the initiator and sensitiser, if used, should not absorb significantly in the visible range of the spectrum to avoid contaminating the final coloured image. Thus, initiator systems sensitive to the UV are most commonly used, although sensitisation to the IR is also possible, e.g., using the initiator sensitiser combinations disclosed in European Patent Publication No. 444786.

Our co-pending British Patent Application of even date discloses that a marked improvement in resolution is seen when the colour photopolymer layer additionally comprises a fluorocarbon additive in an amount to give a fluorocarbon: pigment weight ratio of at least 1:20, preferably at least 1:10.

The upper limit depends to a large extent on the structure of the fluorocarbon, the properties of the other ingredients and the end use, but is seldom greater than 1:1. Typical values are in the range 1:2 to 1:5. Too little fluorocarbon leads to loss of resolution and/or sensitivity, while too much may lead to poor quality coatings lacking structural integrity.

It is believed that the fluorocarbon serves to reduce the cohesive forces within the layer and hence promotes clean shearing of the layer in the direction perpendicular to its major surface.

A wide variety of fluorocarbon compounds may be used, provided they are substantially involatile under normal coating and drying conditions and sufficiently miscible with the binder material(s). Thus, highly insoluble fluorocarbon resins such as PTFE, polyvinylidenefluoride etc. would be excluded, as would gases and low boiling liquids such as the perfluoroalkanes. With the above exceptions, both polymeric and lower molecular weight materials may be used, although the latter are preferred. Suitable materials are disclosed on Page 3 lines 18 to 30 of EP 0433031. Compounds A-1 to A45 and B1 to B3 listed in U.S. Pat. No. 5,034,371 are also useful. Fluorocarbons bearing polymerisable unsaturated groups, e.g., compounds disclosed in U.S. Pat. Nos. 2,803,615, 3,787,351, 3,544,537 and 3,078,245, are particularly suitable because they can participate in the photocuring reaction.

The solutions used to coat the colourant layers may be conveniently prepared by roll-milling the pigment (or mixtures of pigments) and binder in accordance with known techniques to give "pigment chips", adding solvent (acetone, MEK etc.) to produce "millbase", then adding the remaining ingredients and further solvent as required. Different pigment chips (and millbases) may be mixed so as to match any desired hue or shade. In particular, the colours of different printing inks may be reproduced, which is essential for colour proofing.

The barrier layer may be chosen from a wide variety of hydrophilic polymeric materials that are transparent to both visible light and the exposing radiation. Its main function is to isolate the coloured layer from the adhesive layer, especially during coating of the latter, and so preference is. given to materials that may be cast into defect-free films that are largely impervious to a range of organic solvents. The barrier layer may be laminated to the coloured layer or coated as a solution or dispersion. Coating from an aqueous solution or dispersion is preferred, in order to avoid disrupting the coloured layer.

Possible materials for use in the barrier layer include water-soluble polymers, which include proteins, such as gelatin; polysaccharides and their derivatives, such as starches, modified starches, xanthans, hydroxyalkylcelluloses, carboxyalkylcelluloses etc; and synthetic polymers containing large numbers of hydroxyl, carboxyl or other hydrophilic functionalities, such as poly (vinyl alcohol) or polymers and copolymers of hydroxyethyl acrylate, acrylic acid etc.

The preferred material is poly(vinyl alcohol) (PVA), preferably with a high degree of hydrolysis (e.g. >90%). The barrier layer may become crosslinked subsequent to coating and may optionally contain additives such as antihalation dyes (especially UV-absorbing dyes). One or more surfactants are advantageously included in the barrier layer to enhance its wetting properties towards the coloured and adhesive layers, so that coating discontinuities may be avoided and a trilayer with good structural integrity is built up. A wide variety of ionic and nonionic surfactants may be used, but particularly suitable materials for use with PVA include Trisophone Pk (Rhone-Poulenc), Superamide L9C (Millmaster Onyx) Teepol HB7 (Shell Chemicals) and Hamposyl M30 (W. R. Grace & Co.). Mixtures of two or more surfactants may be used, and a surfactant loading in the range 0.1 to 15% w/w of the total solids is typical for a PVA barrier layer. The thickness of the barrier layer will depend on the materials used, but is preferably as thin as possible, consistent with effective barrier properties, in order to minimise dot gain. In the case of PVA, a minimum dry thickness of 1.0 microns is usually necessary and a thickness of 2.0 to 8.0 microns is typical.

An adhesive layer is applied on top of the barrier layer, either by coating or by lamination, but the former is preferred. The function of the adhesive layer is to enable the colour sheet to be laminated either to the chosen base (usually paper or card) or to an imaged colour layer that has previously been applied to the base. Both pressure-sensitive and hot-melt adhesives may be used, but the former are less favoured because of a greater risk of trapping air bubbles when lamination is carried out, and because a removable liner would be required to protect the PSA layer prior to use. The adhesive must satisfy various requirements, such as transparency, flexibility and provision of good adhesion between the barrier coating and the base. In the case of a hot-melt, it should melt sharply at a suitably elevated temperature and solidify quickly on cooling and should not discolour during the process. A wide variety vinyl and acrylic polymers and copolymers are potentially suitable, but clearly the choice of adhesive will depend on the choice of barrier material and any surfactant contained therein. Where the barrier is PVA, good results have been obtained using a copolymer of vinyl acetate and vinyl pyrollidone, available from GAF as a 50% solution in ethanol under the designation E-735. In the interests of reduced dot gain, the adhesive layer should be as thin as possible, consistent with the required adhesive performance. Thicknesses in the range 3 to 12 microns are typical.

The adhesive layer advantageously contains an antihalation dye whose purpose is to absorb light reflected from the base during the imaging exposure. The dye is chosen so as to have the maximum absorption at the exposing wavelength (normally in the UV) but minimal absorption in the visible to avoid contamination of the final coloured image.

The invention will now be illustrated by the following Examples.

EXAMPLE 1

(Negative-Acting)

The following millbases were prepared:

| Cyan Millbase | |
|---|---|
| Modified Resinox | 31 g |
| Butvar B76 | 0.87 g |
| Cyan Pigment Mix | 8.24 g |
| Methyl ethyl ketone | 59 g |
| Magenta Millbase | |
| Modified Resinox | 31 g |
| Magenta Pigment mix | 4.04 g |
| Black Pigment | 0.02 g |
| Methyl ethyl ketone | 60 g |
| Yellow Millbase | |
| Modified Resinox | 31 g |
| Butvar B76 | 0.87 g |
| Yellow Pigment Mix | 5.00 g |
| Methyl ethyl ketone | 60 g |
| Black Millbase | |
| Modified Resinox | 31 g |
| Butvar B76 | 0.87 g |
| Black Pigment | 5.27 g |
| Cyan Pigment | 1.86 g |
| Magenta Pigment | 0.98 g |
| Methyl ethyl ketone | 60 g |

Milling was carried out for in excess of twenty-four hours in a ceramic pot with ceramic balls on a planetary ball mill.

Pigments used were:

Cyan—Pigment Blue 248-0061 (Sunfast), Pigment Blue 249-1282 (Sunfast)

Magenta—Pigment Red RT-698-D (Watchung B), Pigment Magenta RV-6803 (Quindo)

Yellow—Pigment Yellow 275-0562 (Transaperm), Pigment Yellow 1270 Benzidene AAOT

Black—Pigment Carbon Black 300R (Regal)

Modified Resinox is a 29.2% (w/w) solution in 2-butanone of reaction product of 92% (w/w) Resinox 7280 (a phenolic resin commercially available from Monsanto) and 8% (w/w) DDI-1410 (a di-isocyanate commercially available from Henkel).

Butvar B76 is poly(vinyl butyral) commercially available from Monsanto.

Separate colour sheets were prepared by coating each of the following colour layer formulations onto 12μ unsubbed polyester at the indicated wet coating thickness and dried for four minutes at 65° C.

| Cyan Colour Layer | |
|---|---|
| Cyan Millbase | 2.5350 g |
| Trimethylolpropane Trimethacrylate | 0.4000 g |
| Fluorocarbon F1 | 0.0625 g |
| Triazine A | 0.0250 g |
| Butvar B76 | 0.0200 g |
| Wet coating | 4μ |
| Magenta Colour Layer | |
| Magenta Millbase | 2.5350 g |
| Trimethylolpropane Trimethacrylate | 0.4000 g |
| Fluorocarbon F1 | 0.0625 g |
| Triazine A | 0.0250 g |
| Cellulose Acetate Butyrate CAB-500-5 | 0.0750 g |
| Methyl ethyl ketone | 0.3500 g |
| Wet coating | 12μ |
| Yellow Colour Layer | |
| Yellow Millbase | 2.5350 g |
| Trimethylolpropane Trimethacrylate | 0.4000 g |
| Fluorocarbon F1 | 0.0600 g |
| Triazine A | 0.0250 g |
| Butvar B76 | 0.0250 g |
| Methyl ethyl ketone | 3.0000 g |
| Wet thickness | 12μ |
| Black Colour Layer | |
| Black Millbase | 2.5350 g |
| Trimethylolpropane Trimethacrylate | 0.4800 g |
| Fluorocarbon F1 | 0.0625 g |
| Triazine A | 0.0250 g |
| Butvar B76 | 0.0250 g |
| Wet thickness | 4μ |

Triazine A: a triazine with two CCl$_3$ groups and a dimethoxyphenyl substituent.

Fluorocarbon F1 is N-butylperfluorooctane sulphonamido ethyl acrylate, described in U.S. Pat. No. 2,803,615.

An 8% wt/wt aqueous solution of 97.5 to 99.5% hydrolysed poly(vinyl alcohol) (obtained from Fluka) (approximate number average molecular weight 72,000) was prepared.

A mixture of surfactants was prepared by mixing 40 g of a 7.6% weight/weight aqueous solution of Superamide L9C (from Millmaster Onyx) with 6 ml of Teepol HB7 (Shell Chemicals) and made up to 200 ml with distilled water and filtered.

10 g of the poly(vinyl alcohol) formulation were mixed with 3 g of surfactant mixture to provide a barrier coating formulation.

The barrier coating formulation was coated over each of the colour layers at a wet coating thickness of 100μ and dried at 65° C. for eight minutes.

Adhesive Layer

Each barrier layer was then overcoated with an adhesive formulation which contained an antihalation compound. The adhesive was a copolymer of vinyl pyrollidone and vinyl acetate and the adhesive formulation was as follows:

| | |
|---|---|
| GAF E-735 50% wt/wt copolymer in ethanol | 12.5 g |
| Ethanol | 12.5 g |

A saturated solution of Compound B was made up in the above adhesive formulation and coated onto the poly(vinyl alcohol) layer at a wet thickness of 24μ and dried at 65° C. for four minutes.

Compound B $$\text{Et}-\text{O}-\overset{\overset{\displaystyle O}{\|}}{C}\underset{\underset{\displaystyle Me}{\diagup}}{\overset{\overset{\displaystyle H\quad Ph}{\diagdown\;\diagup}}{C}}\overset{\overset{\displaystyle O}{\|}}{\underset{\underset{\displaystyle Me}{\diagdown}}{C}}-\text{O}-\text{Et}$$

with N—H in the ring.

Colour Proofing

Samples of the colour sheets were laminated separately to Matchprint base via the adhesive layer with a 3M 447 Matchprint laminator, then exposed through an UGRA Plate Control Wedge using a 40 to 6K NuArc 6KW frame. After peeling away the polyester sheet, negative images with the following dot resolutions (150 lines/inch) were obtained:

| | % dot |
|---|---|
| cyan | 2 to 98 |
| magenta | 5 to 99 |
| yellow | 2 to 97 |
| black | 1 to 98 |

Full colour proofs were made by lamination of a first coloured sheet to 3M Matchprint base a (resin-coated paper, 300 microns thick), exposure (2.5 NuArc units) and peel-apart; then lamination of the next colour, exposure in register and peeling to give the second colour and so on to give the four colour proof.

EXAMPLE 2

(Negative Acting)

Millbases

Pigment chips were made in accordance with known procedures in a two roll mill, using either three parts pigment to two parts VAGH binder, or one part pigment to one part VAGH binder by weight.

Pigments used were Sun 249-0592 and Sun 248-0615 (cyan), Sun 234-0071 and Mobay RV-6853 (magenta), Harshaw-1270, Sun 275-0570 (yellow) and Raven-760 (black).

VAGH—copolymer of vinyl chloride and vinyl acetate, partially hydrolysed (Union Carbide).

Millbases were made up at 10% weight solids/weight of solution by shaking or stirring the chips in MEK overnight. This resulted therefore in millbases of the 3:2 or 1:1 (pigment: VAGH) types.

Colour Sheets

Colour sheets were prepared by coating the following formulations on the polyester sheet used in Example 1. The barrier layer and adhesive formulations used were the same as in Example 1, except that the barrier layer formulation comprised 0.5 g, Trisophone PK (5% aqueous solution) in place of the surfactant mixture used previously.

| Cyan Sheet | |
|---|---|
| Trimethylolpropane trimethacrylate (Celanese Chem. Co.) | 0.420 g |
| Fluorocarbon F1 | 0.064 g |
| Triazine A | 0.026 g |
| Cyan millbase 1:1 | 4.0170 g |
| MEK | 9.054 g |

The formulation was mixed and coated with a Meyer bar 3 (6.5μ wet), dried one minute at 100° C., overcoated with the 8% PVA formulation (Meyer bar 30 to 65μ wet deposit) and dried for four minutes at 100° C., then overcoated with the adhesive formulation using Meyer bar 12 (26μ wet) and dried two minutes at 100° C. A strip was laminated onto Matchprint Commercial Base using a Matchprint 447 Laminator. Exposure through an UGRA Plate Control Wedge on a 5KW Berkey-Ascor frame (10 units) followed by peel-apart gave a negative image in which the 2% to 98% dots (150 lines/inch) were resolved.

| Magenta Sheet | |
|---|---|
| Trimethylolpropane trimethacrylate (Celanese Chem. Co.) | 0.397 g |
| Fluorocarbon F1 | 0.071 g |
| Triazine A | 0.035 g |
| Magenta millbase 3:2 | 4.00 g |

The formulation was mixed and coated with a Meyer bar 4 (8.5μ wet) and dried one minute at 100° C. This was overcoated and tested as for the cyan sheet. An exposure of 20 units gave a negative image showing 3% to 99.5% dots (150 lines/inch) on peel-apart.

| Yellow Sheet | |
|---|---|
| Trimethylolpropane trimethacrylate (Celanese Chem. Co.) | 0.412 g |
| Fluorocarbon F1 | 0.070 g |
| Triazine A | 0.025 g |
| Yellow millbase 1:1 | 4.019 g |

The above formulation was coated with a Meyer bar 3 and dried one minute at 100° C. Overcoats were applied as for the cyan sheet. Lamination and exposure were carried out as previously described. Exposure of 15 units (Berkey-Ascor 5KW frame) gave a negative image showing 4% to 97% dots (150 lines/inch) on peel-apart.

A full colour proof was assembled as described in Example 1.

EXAMPLE 3

(Positive-working proof)

Colour layer formulations

Pigment chips were made in accordance with known procedures in a two-roll mill, using one part binder resin to one part pigment by weight. The major resin used was Joncryl SCX 690, a styrene-acrylic copolymer of M. W. 15,500 and acid number 240 (supplied by S. C. Johnson b.v., Mijdrecht, The Netherlands). Where necessary a secondary resin, Butvar B98, produced by Monsanto Chemical Co., St. Louis, U.S.A. was used to promote pigment dispersion. In addition, a pigment dispersant, Disperbyk 161, available from BYK Chemie, Wesel, Germany was incorporated in each case. The latter is a 30% solids solution in a solvent mixture, and it was found that at the elevated temperature used in the two-roll milling operation, the solvent content was eliminated by evaporation.~

The constitutions of the finished pigment chips were as follows, by weight:~

| (A) | Cyan chips | |
|---|---|---|
| | 47.17% | Sun cyan pigment 249–0592 |
| | 47.17% | Joncryl SCX 690 resin |
| | 5.66% | Disperbyk 161 solids |
| (B) | Cyan chips | |
| | 47.17% | Sun cyan pigment 248–0615 |
| | 47.17% | Joncryl SCX 690 resin |
| | 5.66% | Disperbyk 161 solids |
| (C) | Magenta chips | |
| | 47.17% | Sun 234–0071 pigment |
| | 47.17% | Joncryl SCX 690 resin |
| | 5.66% | Disperbyk 161 solids |
| (D) | Magenta chips | |
| | 47.17% | Hoechst-Celanese 13–7019 pigment |
| | 35.38% | Joncryl SCX 690 resin |
| | 11.79% | Butvar B98 resin |
| | 5.66% | Disperbyk 161 solids |
| (E) | Yellow chips | |
| | 47.17% | Harshaw 1270 pigment |
| | 35.38% | Joncryl SCX 690 resin |
| | 11.79% | Butvar B98 resin |
| | 5.66% | Disperbyk 161 solids |
| (F) | Yellow chips | |
| | 47.17% | Sun 275–0570 |
| | 35.38% | Joncryl SCX 690 resin |
| | 11.79% | Butvar B98 resin |
| | 5.66% | Disperbyk 161 solids |
| (F) | Black chips | |
| | 47.17% | Columbian Raven 760 pigment |
| | 47.17% | Joncryl SCX 690 resin |
| | 5.66% | Disperbyk 161 solids |

Pigment millbases were then made from these chips at 20% solids content by dispersing one or more of the above chips in a solvent mixture of 1 part by weight ethyl methyl ketone and 1 part by weight 1-methoxy-2-propanol, in a micronising mill for 30–60 minutes.~

The constitutions of the mill-bases were as follows~

| (1) | Cyan millbase |
|---|---|
| | 4 g cyan chips (A) |
| | 4 g cyan chips (B) |
| | 32 g solvent mixture |
| (2) | Magenta millbase |
| | 4 g magenta chips (C) |
| | 4 g magenta chips (D) |
| | 32 g solvent mixture |
| (3) | Yellow millbase |
| | 4 g yellow chips (E) |
| | 4 g yellow chips (F) |
| | 32 g solvent mixture |
| (4) | Black millbase |
| | 8 g black chips (G) |
| | 32 g solvent mixture |

Photopolymerisable colour coatings were then formulated using the above millbases, as follows:

Cyan colour coating:

15 g solvent mixture
0.07 g triazine A, (as in Example 1).
1.0 g trimethylol propane trimethacrylate
6.6 g cyan millbase (1)

Magenta colour coating:

13 g solvent mixture, as above
0.07 g triazine A
0.15 g ethylene glycol dimethacrylate
1.35 g tripropylene glycol diacrylate
8.0 g magenta millbase (2)

Yellow colour coating:

13 g solvent mixture
0.07 g triazine A
1.5 g tripropylene glycol diacrylate
8.0 g yellow millbase (3)

Black colour coating:

13 g solvent mixture
0.07 g triazine A
1.0 g trimethylolpropane trimethacrylate
8.0 g black millbase (4)

Each of the colour layers was coated at 6 microns wet thickness on type MX 813 adhesion-treated Melinex polyester film 23 microns thick, from I.C.I. films, Middlesborough, England, and oven-dried at 90° C. for 1.5 minutes.

Barrier layers

The Coated and dried colour layers were than overcoated with the following polyvinyl alcohol barrier layers.

Barrier for cyan layer:

10 g 8% aqueous solution of polyvinyl alcohol
1 g 5% aqueous solution of Trisophone PK surfactant Barrier for magenta layer:

10 g 8% aqueous solution of polyvinyl alcohol
0.2 g 5% aqueous solution of Hamposyl M30 surfactant Barrier for yellow layer:

10 g 8% aqueous solution of polyvinyl alcohol
0.1 g 5% aqueous solution of Hamposyl M30 surfactant Barrier for black layer:

10 g 8% aqueous solution of polyvinyl alcohol
1 g 5% aqueous solution of Trisophone PK surfactant The grade of polyvinyl alcohol was as used in Example 1. In each case the barrier layer solution was coated on to the colour layer at 24 micron wet thickness, and dried at 65° C. for 6 minutes.

Adhesive layers.

On to each of the barrier layers was coated an adhesive layer containing:

12.5 g GAF E735 copolymer as 50% wt/wt solution in ethanol 12.5 g ethanol

The composition was applied at a wet coating thickness of 24 microns and dried for 3 minutes at 65° C.

Colour Proofing

Samples of each of the above colour sheets were laminated directly to 3M Matchprint base via the adhesive layer, using a 3M Matchprint 447 laminator, then exposed to U-V/blue light through an UGRA plate control wedge in a 3M/Sack 3KW vacuum frame, for an optimum time usually in the range of 1–5 seconds. After peeling away the polyester sheet, positive images were obtained on the Matchprint base with the following dot resolutions (150 lines/inch screen):

|         |           |
|---------|-----------|
| cyan    | 1–98% dots |
| magenta | 1–99% dots |
| yellow  | 2–98% dots |
| black   | 1–98% dots |

Full-colour proofs were made by laminating a cyan colour sheet to Matchprint base, superimposing a cyan half-tone colour separation positive film, exposing to UV/blue light for an optimum time, and peeling away the polyester sheet to produce a positive cyan image on the Matchprint base; laminating a magenta colour sheet on to the cyan image, exposing in register through a corresponding magenta colour separation positive and peeling away the polyester sheet; and repeating these steps with yellow and black colour sheets and separations, to produce a good quality four-colour proof.

When corona-treated polyester was used as the substrate for the colour-sheet coatings instead of the I.C.I. MX813 adhesion-treated polyester, similar results were obtained.

If required, the images formed in the above process can be further hardened by photo-exposure to increase their handleability, or can be protected by lamination with a protective plastic cover-sheet.

EXAMPLE 4

(Positive-acting proof).
Colour layer

In this example, a polyvinyl formal resin was used in the photopolymerisable colour layer, to improve image hardness. A resin with a moderate formal content (about 70%) and acetate content (about 25%), and a low hydroxyl content (about 6%) was chosen for its solubility in acceptable coating solvents. Such a resin is available from Monsanto under the trade name Formvar 12/85. Pigment dispersions were prepared directly as mill-bases, by milling pigments into resin solution for in excess of eight hours in a microniser.

(5) Cyan millbase:
  4 g Formvar 12/85 resin
  32 g 1:1 mixture by weight of ethylmethyl keytone and 1-methoxy-2-propanol
  2 g cyan pigment Sun 249-0592
  2 g cyan pigment Sun 248-0615

The Formvar resin was dissolved in the solvent. mixture, before adding the pigments.

(6) Magenta millbase:
As cyan millbase, except that the cyan pigments were replaced by:
  2 g magenta pigment Sun 234-0071
  2 g magenta pigment Mobay RV 6853

(7) Yellow millbase:
As cyan millbase, except that the cyan pigments were replaced by:
  2 g yellow pigment Harshaw 1270
  2 g yellow pigment Sun 275-0570

The Harshaw pigment was obtained from Inglehart Corp., Louisville, Ky., U.S.A. ps (8) Black millbase:
  2.64 g Alnovol PN320 resin
  2.64 g Butvar B98 resin
  8 g ethyl methyl ketone
  8 g isopropanol
  8 g toluene
  8 g carbon black no. 300R (Cabot Corp)
  2.64 g cyan pigment Sun 249-0592

The resins were dissolved in the solvent mixture before addition of the pigments and milling.

Alnoval PN320 is a novolac phenol-formaldehyde resin supplied by Hoechst AG, Frankfurt, Germany. Colour layer coating solutions:

The millbases were formulated into coating solutions as follows:

Cyan layer coating:
  15 g 1:1 ethyl methyl keytone/1-methoxy-2-propanol solvent mixture
  0.14 g triazine A
  1.0 g trimethylolpropane trimethacrylate
  4.62 g cyan pigment/Formvar millbase (5)
  1.98 g cyan pigment/Joncryl 690 millbase (1) from Example 3.

Magenta layer coating:
  13 g solvent mixture 1:1
  0.07 triazine A
  1.5 g dipentaerythritol pentaacrylate
  7.0 g magenta pigment/Formvar millbase (6)
  1.0 g magenta pigment/Joncryl 690 millbase (2) from Example 3.

Yellow layer coating:
  13 g solvent mixture 1:1
  0.07 g triazine A
  1.5 g tripropylene glycol diacrylate
  3.2 g yellow pigment/Formvar millbase (7)
  4.8 g yellow pigment/Joncryl 690 millbase (3) from Example 3

Black layer coating:
  15 g toluene
  10 g ethanol
  15 g 1-methoxy-2-propanol
  1.5 g Formvar 12/85 resin
  0.2 g triazine A
  1.0 g trimethylolpropane triacrylate
  5.0 g Black millbase (8)

Each of the colour layers was coated at 6 microns wet thickness on type MX813 adhesion-treated polyester. The cyan, magenta and yellow coatings were dried at 90° C. for 1.5 minutes; the black coating was dried at 70° C. for 2 minutes.

Barrier layers

The coated and dried colour layers were then overcoated with the following polyvinyl alcohol barrier layers: Barrier for cyan layer:
  10 g 8% aqueous solution of polyvinyl alcohol
  1 g 5% aqueous solution of Trisophone PK surfactant.

Barrier for magenta layer:
  10 g 8% aqueous solution of polyvinyl alcohol
  0.1 g 5% aqueous solution of Hamposyl M30 surfactant Barrier for yellow layer:
  10 g 8% aqueous solution of polyvinyl alcohol
  0.1 g 5% aqueous solution of Hamposyl M30 surfactant Barrier for black layer:
  10 g 8% aqueous solution of polyvinyl alcohol
  2 g 5% aqueous solution of Trisophone PK surfactant The grade of polyvinyl alcohol used for the cyan, magenta and yellow layer was as in Example 1, coating thickness was 24 microns wet, and drying was at 65° C. for 6 minutes. The grade used for the black layer was polyvinyl alcohol, 100%, hydrolysed, M.W. 14,000 from Aldrich Chemical Co., and the barrier solution was coated at 160 microns wet-thickness, and dried at 70° C. for 4 minutes.

Adhesive layers

On each of the barrier layers was coated an adhesive layer using the same composition, coating thickness and drying conditions as in Example 3.

Colour proofing

Samples of each of the above colour sheets were laminated to 3M Matchprint base, imagewise exposed through an UGRA plate control wedge for an optimum time, and peeled apart as in Example 3. The positive images so formed on the Matchprint base showed the following dot resolutions:

|         |       |
|---------|-------|
| cyan    | 4–98% |
| magenta | 1–98% |
| yellow  | 2–97% |
| black   | 3–97% |

Full-colour proofs were made, as described in Example 3, using the colour sheets of this example. A good-quality four-colour positive proof resulted. The images formed from the colour-sheets of this Example showed an improved hardness compared with those of Example 3.

The words "3M COLOR KEY", "ENCO NAPS", "ENCO PAPS", "KODAK DOUBLE CHECK", "FUJI COLOR ART OVERLAY", "3M MATCHPRINT", "AGFAPROOF", "FUJI COLOR ART", "ENCO PRESS MATCH", "POLAROID SPECTRA PROOF", "CROMALIN", "EUROSPRINT", "CROMACHECK", "RESINOX", "SUPERAMIDE", "TEEPOUL", "TRISOPHONE", "BUTVAR", "HAMPOSYL M30", "JONCRYL" and "FLUORAD" are trade marks.

We claim:

1. A method of preparing a color image which comprises the steps of:

(a) providing a color sheet suitable for use in peel-apart color imaging, said sheet comprising a substrate having a surface bearing a layer of pigmented photopolymerizable material overcoated with a hydrophilic barrier layer and an outer layer of an adhesive, (b) laminating said color sheet, (c) imagewise exposing said sheet through its substrate, (d) peeling said substrate from said sheet to remove either exposed or unexposed regions of said layer of pigmented photopolymerizable material, and (e) repeating steps (a) to (d) with two additional color sheets to build up a color image comprising cyan, magenta, and yellow layers.

2. A method according to claim 1 which additionally comprises respective steps (a) to (d) with a further color sheet having a black pigment to form a full color image comprising cyan, magenta, yellow, and black layers.

3. The method of claim 1 wherein said adhesive comprises a thermal melt polymer or copolymer selected from the group consisting of vinyl and acrylic polymers.

4. The method of claim 1 wherein said adhesive is a thermal melt adhesive.

5. The method of claim 1 wherein said adhesive comprises an acrylic polymer or copolymer which melts sharply at an elevated temperature.

6. The method of claim 5 wherein said exposed regions are removed.

7. The method of claim 3 wherein said adhesive melts sharply at an elevated temperature.

8. The method of claim 4 wherein said adhesive comprises a copolymer of vinyl acetate and vinyl pyrollidone.

9. The method of claim 4 wherein said barrier layer comprises poly(vinyl alcohol).

10. The method of claim 4 wherein said adhesive contains an antihalation dye.

11. A method of preparing a color image which comprises the steps of:

(a) providing a color sheet suitable for use in peel-apart color imaging, said sheet consisting essentially of a substrate having a surface bearing a layer of pigmented photopolymerizable material overcoated with a hydrophilic barrier layer and an outer layer of an adhesive, (b) laminating said color sheet, (c) exposing said sheet through its substrate, (d) peeling the substrate from the sheet to remove either the exposed or the unexposed regions of the pigmented photopolymerizable material, and (e) repeating steps (a) to (d) with two additional color sheets to build up a color image comprising cyan, magenta, and yellow layers.

12. The method of claim 11 wherein said adhesive comprises a thermal melt polymer or copolymer selected from the group consisting of vinyl and acrylic polymers.

13. A method of providing a color image according to claim 1 wherein said barrier layer comprises poly(vinyl alcohol).

14. A method of preparing a color image according to claim 13 wherein said layer of photopolymerisable material comprises a binder, a pigment, a polymerisable monomer, photoinitiator and a sensitiser.

15. A method of preparing a color image according to claim 14 wherein said adhesive layer comprises an antihalation dye.

16. A method of preparing a color image according to claim 15 wherein said adhesive is a hot-melt adhesive.

17. A method of preparing a color image according to claim 14 which induces a negative-acting image.

18. A method of preparing a color image according to claim 14 which produces a positive-acting image.

* * * * *